(12) United States Patent
Howe et al.

(10) Patent No.: US 10,231,360 B2
(45) Date of Patent: Mar. 12, 2019

(54) DUAL-MODE PASSIVE THERMAL MANAGEMENT SYSTEM AND METHOD

(71) Applicant: LOCKHEED MARTIN CORPORATION, Bethesda, MD (US)

(72) Inventors: David T. Howe, Grapevine, TX (US); John Buchan, Benbrook, TX (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 44 days.

(21) Appl. No.: 15/346,785

(22) Filed: Nov. 9, 2016

(65) Prior Publication Data

US 2018/0132383 A1    May 10, 2018

(51) Int. Cl.
| | |
|---|---|
| *F25D 5/00* | (2006.01) |
| *H05K 7/20* | (2006.01) |
| *C09K 5/18* | (2006.01) |
| *F25D 5/02* | (2006.01) |

(52) U.S. Cl.
CPC .......... *H05K 7/20509* (2013.01); *C09K 5/18* (2013.01); *F25D 5/00* (2013.01); *H05K 7/20518* (2013.01); *F25D 5/02* (2013.01)

(58) Field of Classification Search
CPC ................ F25D 5/00; F25D 5/02; C09K 5/18
USPC .............................................................. 62/4
See application file for complete search history.

(56) References Cited

U.S. PATENT DOCUMENTS

| | | |
|---|---|---|
| 3,067,594 A | 12/1962 | Bland et al. |
| 3,230,705 A | 1/1966 | Peterson |
| 4,888,663 A | 12/1989 | Longerich et al. |
| 5,061,914 A | 10/1991 | Busch et al. |
| 5,184,470 A | 2/1993 | Moser et al. |

(Continued)

FOREIGN PATENT DOCUMENTS

| | | |
|---|---|---|
| CN | 101693357 | 4/2010 |
| JP | 60113953 | * 11/1983 |
| JP | 08310562 | * 3/1995 |

OTHER PUBLICATIONS

Endothermic Cooling Cartridge, Nov. 1994, IBM Technical Disclosure Bulletin.*

(Continued)

*Primary Examiner* — Eric Ruppert
(74) *Attorney, Agent, or Firm* — Terry M. Sanks, Esq.; Beusse Wolter Sanks & Maire, PLLC

(57) ABSTRACT

Embodiments include a heat sink cell comprising a first reservoir having a first volume of space and a first material stored in the first volume of space. The first material provides a first heat sink thermal operating range for the transfer of heat. The cell comprises a second reservoir and a second material stored in the second reservoir. A shape memory alloy (SMA) closes an opening of the second reservoir. The SMA is responsive to a temperature change of the first material or external sources to automatically open the opening so that the first material or the second material spontaneously pass through the opening to cause an endothermic reaction or an exothermic reaction between the first material and the second material to create a second heat sink thermal operating range different from the first heat sink thermal operating range. Embodiments also include a system and method of dual-mode passive thermal management.

17 Claims, 6 Drawing Sheets

(56) References Cited

U.S. PATENT DOCUMENTS

| | | | |
|---|---|---|---|
| 5,257,755 A * | 11/1993 | Moser | H05K 7/20281 |
| | | | 102/293 |
| 6,019,025 A | 2/2000 | Amand | |
| 6,224,784 B1 * | 5/2001 | Hayes | A21D 8/06 |
| | | | 165/10 |
| 7,082,354 B2 | 7/2006 | Watanabe | |
| 7,303,328 B2 * | 12/2007 | Faraldi | B01F 11/0071 |
| | | | 1/71 |
| 7,311,703 B2 | 12/2007 | Turovskiy et al. | |
| 7,561,424 B2 * | 7/2009 | Bjork | H01L 23/427 |
| | | | 165/80.4 |
| 7,886,816 B2 | 2/2011 | Ouyang | |
| 8,425,588 B2 | 4/2013 | Molaei | |
| 8,511,082 B2 | 8/2013 | Browne et al. | |
| 8,534,570 B2 | 9/2013 | Tiliakos et al. | |
| 9,608,686 B1 * | 3/2017 | Coulter | H04B 1/3888 |
| 2001/0045104 A1 | 11/2001 | Bailey, Sr. et al. | |
| 2009/0014154 A1 | 1/2009 | Schick et al. | |
| 2010/0038053 A1 | 2/2010 | Maxik et al. | |
| 2010/0319110 A1 | 12/2010 | Preston-Powers | |
| 2014/0190666 A1 | 7/2014 | Schlie et al. | |
| 2015/0060017 A1 | 3/2015 | Chung et al. | |
| 2016/0160609 A1 * | 6/2016 | Bondarenko | E21B 47/011 |
| | | | 166/250.01 |

OTHER PUBLICATIONS

PCT/US2017/060912, International Search Report, dated Feb. 1, 20918.

* cited by examiner

DUAL-MODE PASSIVE THERMAL MANAGEMENT SYSTEM AND METHOD

BACKGROUND

Embodiments relate to a dual-mode passive thermal management system and method having two operating modes for the protection of an external object such as electronic circuitry.

Traditional thermal management approaches for high-speed missile applications involve heat exchangers and/or phase change materials to cool critical missile electronics. Some missiles also use active electric systems or cryogenic cooling systems which require higher electrical loads or use of super cooled liquids prior to loading the missile onto the launcher.

SUMMARY

Embodiments herein relate to a dual-mode passive thermal management system and method having two operating modes for the protection of electronic circuitry. An aspect of the embodiments includes a heat sink cell comprising: a first reservoir having a first volume of space, and a first material stored in the first volume of space. The first material provides a first heat sink thermal operating range for the transfer of heat. The heat sink cell comprises a second reservoir having a second volume of space and an opening to the second volume of space and a second material stored in the second volume of space. A shape memory alloy (SMA) is coupled to and closes the opening of the second reservoir. The SMA is responsive to a temperature change of the first material, or responsive to temperature change(s) external to the first material, to automatically open the opening so that the first material or the second material spontaneously pass through the opening to cause an endothermic or exothermic reaction between the first material and the second material to create a second heat sink thermal operating range different from the first heat sink thermal operating range.

Another aspect of the embodiments includes a system comprising: a heat sink cell having a first heat sink thermal operating range being a function of temperatures of thermal operating limits of an external object and including a shape memory alloy (SMA) responsive to a predetermined activating temperature in the heat sink cell to cause an endothermic or exothermic reaction to provide fail-safe thermal protection to the external object. The system includes a thermal conducting conduit (TCC) for the transfer of heat between the external object and the heat sink cell.

Another aspect of the embodiments include a method comprising: operating an heat sink cell at a first heat sink thermal operating range being a function of temperatures of thermal operating limits of an external object; transferring by a thermal conducting conduit (TCC) heat between the external object and the heat sink cell to change a temperature of a first material in the heat sink cell; activating a shape memory alloy (SMA) responsive to a predetermined activating temperature of the first material or to a predetermined activating temperature external to the first material in the heat sink cell to cause spontaneous combining or dissolving of a second material with the first material to effectuate an endothermic or exothermic reaction; and transferring by thermal conducting conduit (TCC) heat between the external object to the heat sink cell, after the endothermic or exothermic reaction, to provide fail-safe thermal protection to the external object.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1A:
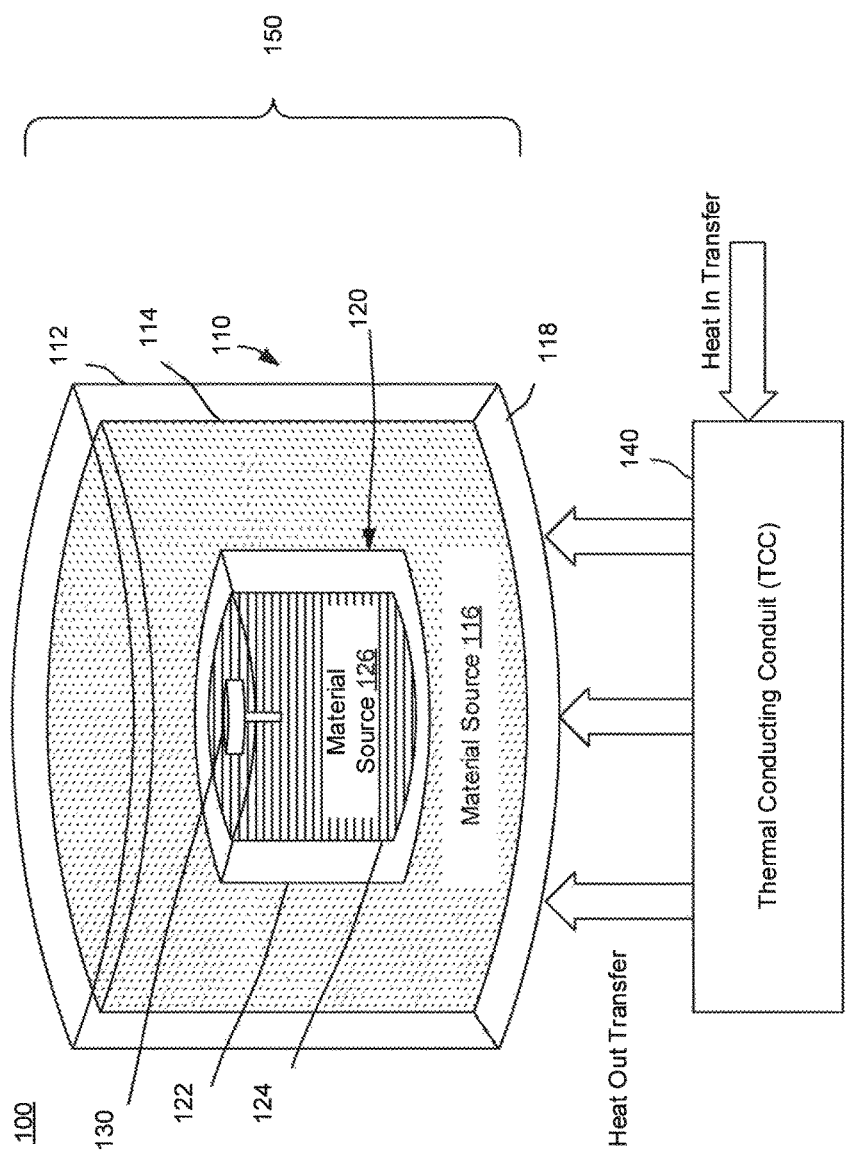
FIG. 1A illustrates a dual-mode passive thermal management system in a first mode.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

The inventor has determined that in high-supersonic and/or hypersonic flights, as flight time increases, the temperature differentials throughout the missile decrease. This limits the options for transferring heat from hotter regions of the missile to cooler regions.

The terms front, back and side are only used as a frame of reference for describing components herein and are not to be limiting in any way.

Figure 1B:
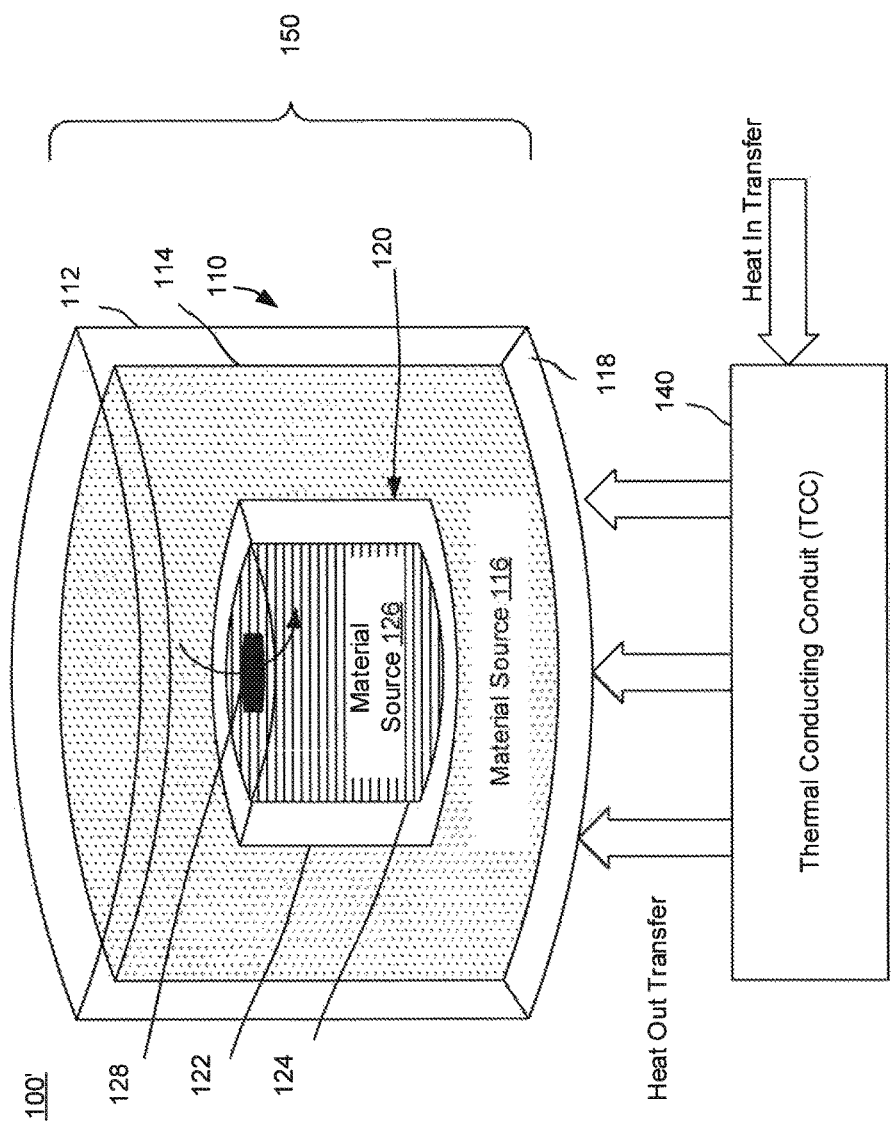
FIG. 1B illustrates the dual-mode passive thermal management system in a second mode.

The embodiments in FIGS. 1A and 1B are described herein in relation to an endothermic reaction with the flow of heat to the cell 150 from an external object. However, as will be described herein, the TCC 140 may be configured to flow heat from the cell 150 to an external source to cause or effectuate an exothermic reaction.

FIG. 1A illustrates a dual-mode passive thermal management system 100 in a first mode. The system 100 may include a heat sink cell 150 and a thermal conducting conduit (TCC) 140. The heat sink cell 150 may operate to provide a first thermal response in accordance with a first temperature range and a second thermal response in accordance with a second temperature range without the use of electricity to switch from the first temperature range to the second temperature range wherein the first temperature range and the second temperature range are different temperature ranges. In operation, the first temperature range may be a first phase temperature range and the second temperature range may be a second phase temperature range such that the first phase temperature range is warmer or colder in temperature than the second phase temperature range.

The second thermal response may provide a fail-safe thermal response for the protection of electronics operation out of the manufacturing limits during real-time use of the electronics. The fail-safe thermal response may be configured to the lower end or the upper end of operational temperature limits of a protected external object such as electronics.

The heat sink cell 150 may comprise a first reservoir 110 and a second reservoir 120 wherein the second reservoir 120 is internal to the first reservoir 110. The first reservoir 110 includes a housing 112 having a first volume of space bounded by interior surface 114 of housing 112. The second reservoir 120 includes a housing 122 having a second volume of space bounded by interior surface 124 of housing 122. The second reservoir 120 may include an opening (i.e., opening 128 shown in FIG. 1B). The egress through the opening may be controlled by a thermally-responsive shape memory alloy (SMA) 130. The SMA 130 may include Nitinol or other SMA material.

In an embodiment, the system 100 may provide on-demand cooling for electronics through an endothermic reaction initiated by a thermally-responsive shape memory alloy (SMA) 130 without the use of electrical energy to detect temperatures or cause the endothermic reaction. By way of non-limiting example, the electronics may be operated in an environment where both the electronics and the environment surrounding the electronics increase in temperature. In real-time operation, the temperature of the electronics may be caused to increase near, to or above the operational temperature limits of the electronics. The system 100 may be configured to spontaneously cause on-demand cooling of the electronics including when conditions approach the operational limits for the thermal protection of the electronics.

In an embodiment, the system 100 may provide on-demand heating for electronics through an exothermic reaction initiated by a thermally-responsive shape memory alloy (SMA) 130 without the use of electrical energy to detect temperatures or cause the exothermic reaction. By way of non-limiting example, the electronics may be operated in an environment where both the electronics and the environment surrounding the electronics decrease in temperature. In real-time operation, the temperature of the electronics may be caused to decrease near, to or below the operational temperature limits of the electronics. The system 100 to spontaneously cause on-demand heating for the thermal protection of the electronics.

Figure 6:
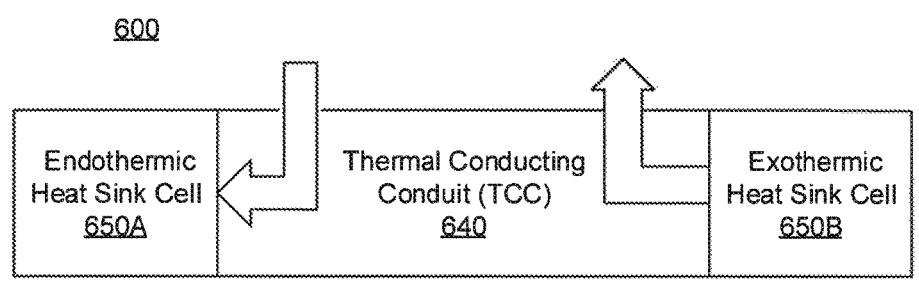
FIG. 6 illustrates an endothermic and exothermic dual-mode passive thermal management system.

FIG. 6 illustrates an endothermic and exothermic dual-mode passive thermal management system 600. The system 600 includes a TCC 640 having an endothermic heat sink cell 650A coupled to the TCC 640 at a first location and an exothermic heat sink cell 65013 coupled to a second location of the TCC 640. The endothermic heat sink cell 650A may be configured to protect an external object at an upper limit of the operational range of the external range. The exothermic heat sink cell 650B may be configured to protect an external object at a lower limit of the operational range of the external range. The operation of the heat sink cell has been previously described. The TCC 640 would operate to transfer heat between one of the heat sink cells 650A or 650B and an external object depending on the current real-time state of the external object.

The first reservoir 110 may be configured to store therein a first material source 116 denoted by the dotted area within the volume of space between the housing 122 of the second reservoir and the interior surface 114 of the first reservoir 110. The second reservoir 120 may store therein a second material source 126 denoted by the horizontal lines within the volume of space of the second reservoir 120. The first reservoir 110 may include an opening (not shown) for filling the reservoir 110 with the fist material source 116. The first material may be $H_2O$ and the second material may be Ammonium Nitrate, $NH_4NO_3$.

In an embodiment, the first reservoir 110 and the second reservoir 120 are depicted as having an available volume of space filled with the material. In operation, the volume of space in the first reservoir 110 and the second reservoir 120 may be not be completely filled. However, the first material source 116 may be in direct or indirect contact with at least one surface of the SMA 130, as will be described in more detail in relation to FIGS. 3A-3C. The first material source 116 and the second material source 126 are selected such that upon combining these materials, in part or whole, a spontaneous endothermic reaction occurs which causes a temperature change in the heat sink cell 150. In some embodiments, the temperature change is a decrease in temperature of at least the first reservoir 110. In some embodiments, the temperature is an increase in temperature of at least the first reservoir 110 through an exothermic reaction.

The system 100 may further include a thermal conducting conduit (TCC) 140. The TCC 140 is coupled to or interfaced with at least one surface 118 of the first reservoir 110 to transfer heat to the first reservoir 110 such that the temperature of the first material source 116 rises. The first reservoir 110 and/or second reservoir 120 and the stored first material source 116 and/or the stored second material source 126 may be configured to provide a heat sink cell 150 for the transfer of heat from a source of heat (i.e., electronics 480) to the heat sink cell 150 in a first mode. In the first mode, an endothermic reaction is not required for the transfer of heat from an external source of heat to the heat sink cell 150. In the first mode, the heat sink cell 150 maintains a first thermal response in accordance with a first temperature range. The first thermal response is configured to support the transfer of heat to the first reservoir 110 from the external source of heat (i.e., electronics 480).

By way of non-limiting example, the first temperature range may be a function of the temperature operating range of electronics (i.e., electronics 480) for which the electronics are engineered to operate. By way of non-limiting example, the temperature operating range of the electronics may be −30° C. to +68° C. While a specific range is referenced, the electronics (i.e., electronics 480) may be engineered for many other operating ranges and such ranges may be narrower or wider than the range −30° C. to +68° C.

By way of non-limiting example, the system 100 may be configured to generate heat to protect the electronics if the environment and electronics will tend to function at the lower temperature range such that the system 100 may warm the electronics.

FIG. 1B illustrates the dual-mode passive thermal management system 100 in a second mode. In the second mode, the SMA 130 shape changes to automatically open in whole or part the opening 128 of the second reservoir 120 of the heat sink cell 150. For illustrative purposes, the opening 128 is represented as being entirely open.

The opening 128 may be configured to provide access to the material source 126 stored in the second reservoir 120. Based on the configuration of the first reservoir 112 and the second reservoir 120 and the position of opening 128 controlled by the SMA 130, the first material source 116 and the second material source 126 combine, such as by acts of gravity, spontaneous fluid (gas, solid or liquid) flow, a combination of gravity and spontaneous fluid flow, which causes an endothermic reaction between the first material source 116 and the second material source 126. In some embodiments, the spontaneous fluid (gas, solid or liquid) flow may be caused by missile acceleration forces during flight or by state changes of the material as a result of temperature change.

The first material source 116 may be permitted to enter through the opening 128 of the second reservoir 120 denoted by the arrows. The first material source 116 and the second material source 126 combine or dissolve such that the combining or dissolving of the first material source 116 and the second material source 126 causes an endothermic reaction to rapidly decrease the temperature of the heat sink cell 150. Thus, the heat sink cell 150 is automatically initiated via the SMA 130 when a predetermined temperature is reached. In some embodiments, the temperature may be caused to increase through use of an exothermic reaction.

As known in thermodynamics, heat is transferred from a hot area to a cold area. Thus, area of the electronics (i.e., electronics 480) including the electronics is subjected to an elevation of temperature as a result of operation. In an embodiment where the electronics is installed in a missile, the area surrounding the electronics may also rise as a natural course of operation of the missile during flight. The heat generated or created in the area of the electronics and/or by the electronics is transferred automatically to the heat sink cell 150 through the TCC 140.

Once the heat sink cell 150 reaches a certain temperature, the heat sink cell 150 will automatically create an endothermic reaction, where the certain temperature is an activating temperature resulting from the current operational temperature at the area of the electronics and/or the electronics being at or near the upper limit of the operational range. The system 100 does not require any electricity to cause the endothermic reaction; the reaction may be spontaneous as a result of real-time temperature conditions at the electronics (i.e., electronics 480) as transferred to the heat sink cell 150.

The heat sink cell 150 may produce an endothermic reaction which creates a very high heat differential between the current operating temperature of the electronics and the heat sink cell 150. The high heat differential may be above the maximum thermal limit of the electronics so that heat can flow from the electronics to the heat sink cell 150 for the thermal protection of the electronics when the electronics and/or surrounding area approach the thermal operating limits of the electronics.

In one embodiment, the transfer of the first material source to the second reservoir is based on material flow as the SMA 130 shrinks or shape changes to automatically create a void or gap in the opening to the interior volume of space housing the second material source 126.

The TCC 140 may include heat pipes, heat spreaders and/or heat sink. The heat pipes and heat spreaders are commercially available by Advanced Cooling Technologies, Inc. and others. The TCC 140 may include a combination of a heat sink embedded with heat pipes and/or heat spreaders to increase the thermal performance of a heat sink. The TCC 140 may include a heat sink constructed of a thermally conductive material to include, but not limited to, aluminum, steel, copper, graphene, or other composite materials.

By way of non-limiting example, $NH_4NO_3$ has $\Delta$sol $H°=+25.69$ kJ/mol where $\Delta$sol $H°$ is the molar solvation enthalpy. With a molar mass of 80.04 g/mol, $NH_4NO_3$ has $\Delta$sol $H°+320.95$ kJ/kg. By way of non-limiting example, 421 grams of $NH_4NO_3$ can dissolve in 100 grams of $H_2O$ at 60° C., one likely operating temperature of the heat sink cell. A mass of 0.238 kg (kilograms) of $H_2O$ (water) may be required to dissolve 1.0 kg of $NH_4NO_3$ (ammonium nitrate) at 60° C. For 1.238 kg Total Solution Mass, 320.95 kJ (kilojoules) of heat removal may be achieved. Thus, 259.2 kJ of heat removal/kg of solution may be achieved.

A table of molar enthalpy (heat) of solution at infinite dilution for some common uni-univalent electrolytes can be found in Parker, V. B., *Thermal Properties of Uni-Univalent Electrolytes,* Natl. Stand. Ref. Data Series—Natl. Bur. Stand. (U.S.), No. 2, 1965, incorporated herein by reference. The table identifies the enthalpy change when 1 mol. of solute in its standard state is dissolved in an infinite amount of water. Values are given in kilojoules (kJ) per mole at 25° C. While a specific example of ammonium nitrate and water is described herein, other chemical compounds may be used and may vary based on the temperature range of operation. Another example could be ammonium perchlorate (NH4ClO4) in $H_2O$. By way of non-limiting example, for an exothermic reaction, potassium perchlorate ($KClO_4$) in $H_2O$ (water) may be used. A Solubility Table can also be found at wikipedia.org/wiki/Solubility table for use in designing the endothermic or exothermic reaction for the operational parameters of the external object.

In FIGS. 1A and 1B, the heat transfer is represented as flowing from an external source to the heat sink cell 150. However, if the exothermic heat sink cell 150 transfers heat to the external source, the TCC 140 may be configured to support the transfer of heat from the exothermic heat sink cell 150.

While the embodiment of FIGS. 1A and 1B illustrates a single second reservoir (i.e., second reservoir 120), the first reservoir 110 may include one or more reservoirs configured for staged endothermic or exothermic reactions at different temperature set points for the protection of the electronics or other external object. In other words, the SMA of each reservoir internal to the first reservoir may have a different temperature setting for the shape change to occur. By way of non-limiting example, the first reservoir 110 may have compartments wherein each compartment may include a reservoir with an SMA set to a different temperature setting.

In some embodiments, the heat sink cell 150 may instead of receiving heat may transfer heat to an external object.

Figure 2:
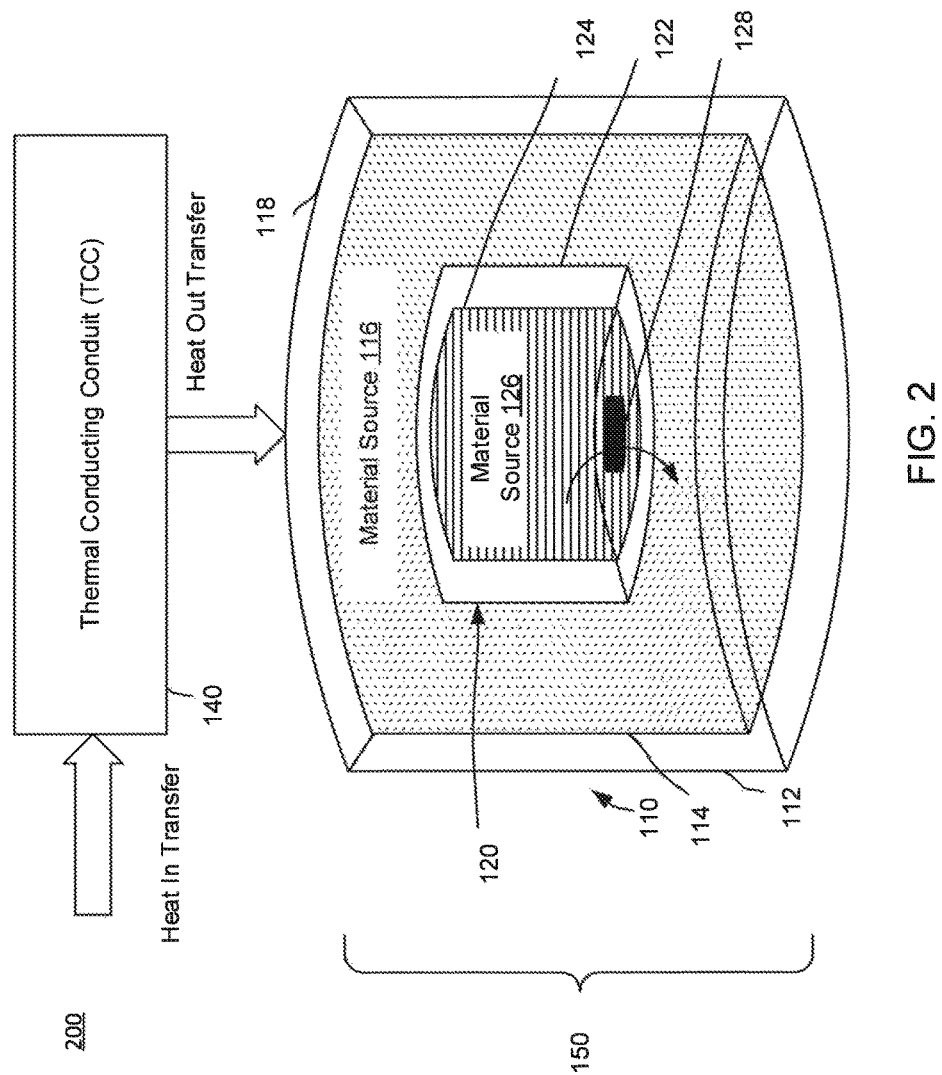
FIG. 2 illustrates another dual-mode passive thermal management system in a second mode.

FIG. 2 illustrates another dual-mode passive thermal management system 200 in a second mode. FIG. 2 is similar to the embodiments of FIGS. 1A and 1B. Thus, only the differences will be described. In FIG. 2, the opening 128 is oriented such that gravity may act in part on second material source 126 within the second reservoir 120 to exit the second reservoir 120 and combine or dissolve with the first material source 116.

Figure 3:
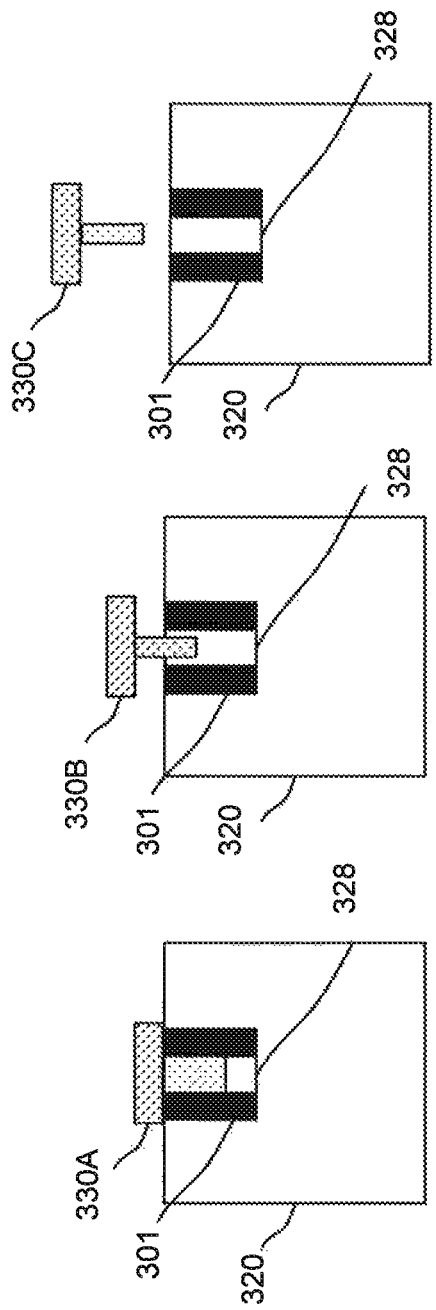
FIG. 3A illustrates a second reservoir with a lid closed.
FIG. 3B illustrates the second reservoir with the lid in an intermediate position.
FIG. 3C illustrates the second reservoir with the lid in a fully open position.

FIG. 3A illustrates a second reservoir 320 with a lid, cover, or cap including SMA 330A in a closed position. FIG. 3B illustrates the second reservoir 320 with the lid including SMA 330B shaped changed and in an intermediate position, for example. In the intermediate position, the opening into the second reservoir 320 is partly opened. FIG. 3C illustrates the second reservoir 320 with the lid, cover, or cap including SMA 330C in a fully open position. SMA 330C was subjected to a shape change in FIG. 3B. In some embodiments, the lid, cover, or cap may fall via gravity. In some embodiments, the lid, cover, or cap may lift. For example, the lid, cover, or cap may be configured to be buoyant in the first material source 116, in some embodiments. The lid, cover, or cap may be coupled in the opening 328 and secured via a rubber O-ring or other seal. In some embodiments, the O-ring or seal may be integrated in the lid, cover, or cap.

Figure 4:
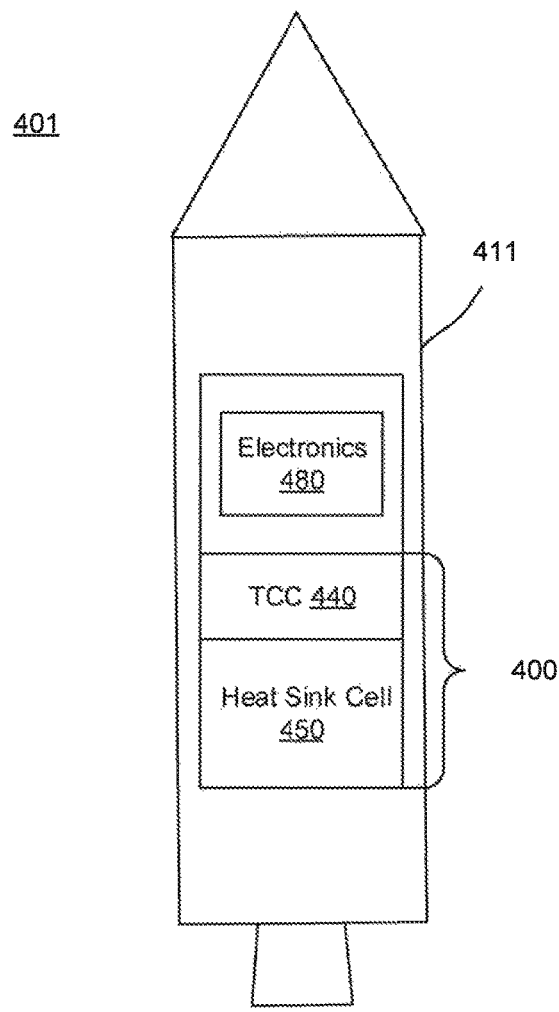
FIG. 4 illustrates a missile employing the dual-mode passive thermal management system.

FIG. 4 illustrates a missile 401 employing the dual-mode passive thermal management system 400. The missile 401 includes a missile housing 411. The missile housing 411 housing therein electronics 480 configured to operate the missile during flight. The electronics 480 may control various operations of the missile including, but not limited to, thruster operations, control surfaces, flight navigation, imaging, etc. The system 400 may be in contact directly or indirectly with at least one surface of electronics 480 for the transfer of heat, for example. The electronics 480 and the dual-mode passive thermal management system 400 may be interfaced together such as via the TCC 440

Figure 5:
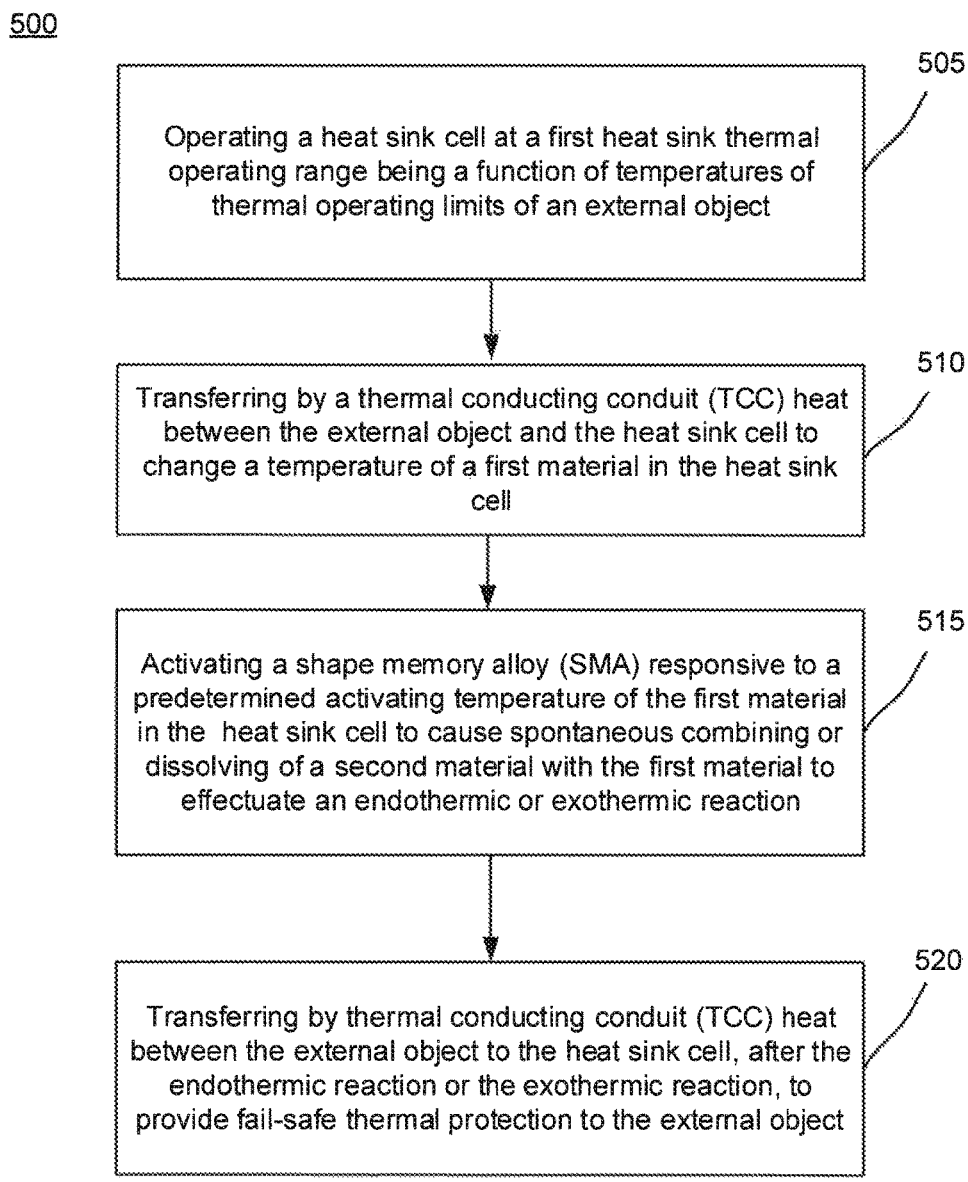
FIG. 5 illustrates a method of protecting electronics from overheating during operation.

FIG. 5 illustrates a method 500 of protecting electronics from overheating during operation. The method 500 may provide thermal protection of electronics in a missile 401. The blocks of the method 500 may be performed in the sequence shown or in a different order. In some embodiments, one or more of the blocks may take place simultaneously. Furthermore, blocks may be added or removed.

The method 500 includes, at block 505, operating a heat sink cell at a first heat sink thermal operating range being a function of temperatures of thermal operating limits of an external object. At block 510, the method 500 includes transferring by a thermal conducting conduit (we) heat from the external object to the heat sink cell to change a temperature of a first material in the heat sink cell. At block 515, the method 500 includes activating a shape memory alloy (SMA) responsive to a predetermined activating temperature of the first material in the heat sink cell to cause spontaneous combining or dissolving of a second material with the first material to effectuate an endothermic reaction or an exothermic reaction. At block 520, the method 500 includes transferring by thermal conducting conduit (TCC) heat between the external object and the heat sink cell, after the endothermic or exothermic reaction, to provide fail-safe thermal protection to the external object. In some embodiments, the method would provide fail-safe thermal protection to the external object at both ends (maximum limits) of the operational limit range of the external object.

Unless otherwise defined, all terms (including technical and scientific terms) used herein have the same meaning as commonly understood by one of ordinary skill in the art to which embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Therefore, the breadth and scope of the subject matter provided herein should not be limited by any of the above explicitly described embodiments. Rather, the scope of the embodiments should be defined in accordance with the following claims and their equivalents.

We claim:

1. A heat sink cell comprising:
   a first reservoir having a first volume of space;
   a first material stored in the first volume of space, the first material providing a first heat sink thermal operating range for the transfer of heat;
   a second reservoir having a second volume of space and an opening to the second volume of space;
   a second material stored in the second volume of space; and
   a shape memory alloy (SMA) coupled to and closing the opening of the second reservoir, the SMA being responsive to a temperature change of the first material to automatically open the opening so that the first material or the second material spontaneously pass through the opening to cause an endothermic reaction or an exothermic reaction between the first material and the second material to create a second heat sink thermal operating range different from the first heat sink thermal operating range, wherein:

the first heat sink thermal operating range being a function of temperatures of thermal operating limits of an external object;

the second heat sink thermal operating range being a function of temperatures at or near a range limit of the thermal operating limits of the external object;

the first material acts as a heat sink cell for transfer of heat from the external object to the first material and the first material being in direct contact with the SMA; and the SMA is positioned within the opening and automatically shrinks within the opening to open the opening at a predetermined activating temperature corresponding to a real-time temperature of the first material, the predetermined activating temperature being a function of a temperature at or near a maximum limit of the thermal operating limits of the external object to provide fail-safe thermal protection to the external object.

2. The heat sink cell of claim 1, wherein the second reservoir further comprising a lid being coupled to the SMA, the lid and SMA closing the opening wherein at least one of the first material and the second material passes through the opening by a force of gravity, spontaneous fluid flow, or a combination of gravity and spontaneous fluid flow, acting on either of the first material and the second material.

3. The heat sink cell of claim 1, wherein the first reservoir includes at least one surface to allow the transfer of heat to the first material.

4. A system comprising:
a heat sink cell having a first heat sink thermal operating range being a function of temperatures of thermal operating limits of an external object and including a shape memory alloy (SMA) responsive to a predetermined activating temperature reached by a material in the heat sink cell to cause an endothermic reaction or an exothermic reaction to provide fail-safe thermal protection to the external object; and a thermal conducting conduit (TCC) for the transfer of heat between the external object and the heat sink cell to cause changes in a current temperature of the material in the heat sink cell to activate the SMA to initiate the fail-safe thermal when the predetermined activating temperature is reached by the material, wherein the material is a first material and the heat sink cell comprising:

a first reservoir having a first volume of space;

the first material stored in the first volume of space, the first material providing the first heat sink thermal operating range;

a second reservoir having a second volume of space and an opening to the second volume of space, wherein the SMA is coupled in the opening and closes the opening of the second reservoir; and a second material stored in the second volume of space wherein when the first material reaches the predetermined activating temperature, causing the SMA to shrink within the opening to automatically open the opening so that the first material or the second material spontaneously pass through the opening to cause the endothermic reaction or the exothermic reaction, the endothermic reaction or the exothermic reaction being between the first material and the second material to create a second heat sink thermal operating range different from the first heat sink thermal operating range.

5. The system of claim 4, wherein at least one of the first material and the second material passes through the opening by a force of gravity, spontaneous fluid flow, or a combination of gravity and spontaneous fluid flow, acting on either of the first material and the second material.

6. The system of claim 4, wherein the second reservoir is internal to the first reservoir.

7. The system of claim 4, wherein the first material is water; and the second material is ammonium nitrate.

8. The system of claim 4, wherein the first reservoir includes at least one surface to allow the transfer of heat to the first material.

9. The system of claim 4, wherein the TCC includes at least one of a heat pipe, heat spreaders and a heat sink.

10. The system of claim 4, further comprising the external object, wherein the external object comprises at least one processor and memory.

11. The system of claim 10, further comprising a missile having a missile housing, the missile housing having the external object, the TCC and the heat sink cell installed therein.

12. A method comprising:
operating a heat sink cell at a first heat sink thermal operating range being a function of temperatures of thermal operating limits of an external object;

transferring by a thermal conducting conduit (TCC) heat between the external object and the heat sink cell to change a temperature of a first material in the heat sink cell;

activating a shape memory alloy (SMA), responsive to a predetermined activating temperature of the first material in the heat sink cell, to cause the SMA to shrink within a reservoir opening and open the reservoir opening of a reservoir storing a second material and to cause spontaneous combining or dissolving of the second material with the first material to effectuate an endothermic reaction or an exothermic reaction as either of the first material or the second material passes through the open reservoir opening; and transferring, by thermal conducting conduit (TCC), heat between the external object and the heat sink cell, after the endothermic reaction or the exothermic reaction, to provide fail-safe thermal protection to the external object.

13. The method of claim 12, wherein the reservoir is a second reservoir and further comprising: providing the heat sink cell, the providing of the heat sink cell comprises:
providing a first reservoir having a first volume of space;
storing the first material in the first volume of space, the first material providing the first heat sink thermal operating range;
providing the second reservoir having a second volume of space and the reservoir opening opens to the second volume of space, wherein the SMA is coupled in the reservoir opening and closes the reservoir opening of the second reservoir; and
storing the second material in the second volume of space; and
further comprising:
automatically opening the reservoir opening wherein the SMA is responsive to a temperature of the first material to automatically open the opening; and
spontaneously passing the first material or the second material through the opening to cause the endothermic reaction or the exothermic reaction, the endothermic reaction or the exothermic reaction being between the first material and the second material to create a second heat sink thermal operating range in the heat sink cell different from the first heat sink thermal operating range.

14. The method of claim 13, wherein at least one of the first material and the second material passes through the opening by a force of gravity, spontaneous fluid flow, or a combination of gravity and spontaneous fluid flow, acting on either of the first material and the second material.

15. The method of claim 13, wherein the first material is water; and the second material is ammonium nitrate.

16. The method of claim 13, wherein the first reservoir includes at least one surface to allow the transfer of heat to the first material.

17. A heat sink cell comprising:
a first reservoir having a first volume of space;
a first material stored in the first volume of space, the first material providing a first heat sink thermal operating range for the transfer of heat;
a second reservoir having a second volume of space and an opening to the second volume of space;
a second material stored in the second volume of space; and
a shape memory alloy (SMA) coupled to and closing the opening of the second reservoir, the SMA being responsive to a temperature change of the first material to automatically open the opening so that the first material or the second material spontaneously pass through the opening to cause an endothermic reaction or an exothermic reaction between the first material and the second material to create a second heat sink thermal operating range different from the first heat sink thermal operating range, wherein the second reservoir further comprising a buoyant lid being coupled to the SMA, the buoyant lid and SMA closing the opening and wherein the buoyant lid is buoyant in the first material.

* * * * *